(12) United States Patent
Retz et al.

(10) Patent No.: US 9,593,807 B2
(45) Date of Patent: Mar. 14, 2017

(54) HELIUM VESSEL PORT ARRANGEMENT FOR A MAGNETIC RESONANCE IMAGING SYSTEM

(71) Applicant: SIEMENS HEALTHCARE LIMITED, Camberley (GB)

(72) Inventors: Patrick William Retz, Witney (GB); Neil Charles Tigwell, Witney (GB)

(73) Assignee: Siemens Healthcare Limited, Frimley, Camberley (GB)

( * ) Notice: Subject to any disclaimer, the term of this patent is extended or adjusted under 35 U.S.C. 154(b) by 0 days.

(21) Appl. No.: 15/110,290

(22) PCT Filed: Dec. 18, 2014

(86) PCT No.: PCT/EP2014/078577
§ 371 (c)(1),
(2) Date: Jul. 7, 2016

(87) PCT Pub. No.: WO2015/104161
PCT Pub. Date: Jul. 16, 2015

(65) Prior Publication Data
US 2016/0334060 A1    Nov. 17, 2016

(30) Foreign Application Priority Data

Jan. 7, 2014  (GB) .................................. 1400201.8
Jun. 12, 2014 (GB) .................................. 1410505.0

(51) Int. Cl.
*G01V 3/00* (2006.01)
*F17C 3/08* (2006.01)
(Continued)

(52) U.S. Cl.
CPC ................ *F17C 3/085* (2013.01); *F17C 6/00* (2013.01); *G01R 33/3804* (2013.01);
(Continued)

(58) Field of Classification Search
CPC .................................................. G01R 33/3804
(Continued)

(56) References Cited

U.S. PATENT DOCUMENTS 4,635,451 A    1/1987  Laskaris
4,782,671 A *  11/1988 Breneman ............... F17C 3/085
                                                          174/15.4
(Continued)

FOREIGN PATENT DOCUMENTS

DE    102005058647 B3    8/2007
GB         2465556 A     5/2010

*Primary Examiner* — Louis Arana
(74) *Attorney, Agent, or Firm* — Schiff Hardin LLP (57) ABSTRACT

A cryogen vessel port arrangement for a magnetic resonance imaging (MRI) system has a port for guiding cryogen into a cryogen vessel. The port has a siphon tube, a siphon cone, which is in flow connection with the siphon tube, and a pipe with an inlet opening and an outlet opening. The inlet opening is configured for connecting it with a coldhead sock and the outlet opening is in flow connection with the port and the siphon cone. The port has a port component that has a flow channel with a first opening configured for connecting it with a service siphon, a second opening in flow connection with the siphon cone, and a third opening in flow connection with the outlet opening of the pipe.

14 Claims, 5 Drawing Sheets

(51) Int. Cl.
   *G01R 33/3815* (2006.01)
   *G01R 33/38* (2006.01)
   *F17C 6/00* (2006.01)

(52) U.S. Cl.
   CPC .... *G01R 33/3815* (2013.01); *F17C 2221/017* (2013.01); *F17C 2260/02* (2013.01); *F17C 2270/02* (2013.01)

(58) Field of Classification Search
   USPC .............................. 324/319, 320, 318, 322
   See application file for complete search history.

(56) References Cited

U.S. PATENT DOCUMENTS

| | | | |
|---|---|---|---|
| 6,289,681 B1* | 9/2001 | Eckels | F17C 3/085 335/216 |
| 2007/0130961 A1 | 6/2007 | Xu et al. | |
| 2008/0307800 A1* | 12/2008 | Levin | F17C 9/00 62/50.7 |
| 2009/0293504 A1* | 12/2009 | Oomen | F25D 19/006 62/51.1 |
| 2010/0051307 A1 | 3/2010 | Tigwell et al. | |
| 2015/0027559 A1* | 1/2015 | Retz | F16K 17/16 137/68.19 |

* cited by examiner

HELIUM VESSEL PORT ARRANGEMENT FOR A MAGNETIC RESONANCE IMAGING SYSTEM

BACKGROUND OF THE INVENTION

Field of the Invention

The present invention relates to a helium vessel port arrangement and a helium vessel arrangement for magnetic resonance imaging (MRI) systems, especially for superconducting magnet systems with a helium cooling system. It further relates to a method for operating the helium vessel port arrangement.

Description of the Prior Art

Magnetic resonance imaging (MRI) systems typically comprise superconducting magnets and a helium cooling system. In the helium cooling system the gaseous helium is recondensed by means of a coldhead and guided into a helium vessel.

To exchange the coldhead the magnet has to be ramped down because the coldhead sock is connected to the helium vessel by a pipe. Failure to do this could, in the event of a quench result in a dangerous amount of helium gas escaping into the region of the Service Engineer carrying out the cold head exchange.

Furthermore, during coldhead exchange there is a risk of air ingress and subsequent ice build-up in the coldhead sock and connecting pipe. During the life of the magnet ice can collect in the pipe connecting the coldhead sock to the turret which is difficult to remove. The removal of the coldhead is necessary to carry out the de-ice operation which also requires the magnet to be ramped down. Currently in order to exchange a coldhead it has been necessary to ramp the magnet down. Also in order to de-ice the connecting pipe it has been necessary to ramp the magnet down and remove the coldhead.

SUMMARY OF THE INVENTION

It is therefore an objective of the present invention to provide an advantageous helium vessel port arrangement for magnetic resonance imaging systems, a magnetic resonance imaging system and a method to operate this arrangement, which especially allows an exchange of a coldhead without ramping down the magnet.

The inventive helium vessel port arrangement for a magnetic resonance imaging (MRI) system comprises a port for guiding helium into a helium vessel. Part of the helium vessel port comprises a siphon tube, a siphon cone and a pipe or flow channel. The siphon cone is in flow connection with the siphon tube. The pipe or flow channel comprises an inlet opening and an outlet opening. The inlet opening is configured for connecting it with a coldhead sock, more precisely for providing a flow connection with the cold head sock. The outlet opening is in flow connection with the port and the siphon cone. The port comprises a port component. The port component comprises a flow channel with a first opening configured for connecting the flow channel with a service siphon, a second opening which is in flow connection with the siphon cone, and a third opening which is in flow connection with the outlet opening of the pipe connected to the coldhead sock.

The above described difficulties have been solved by extending the coldhead connection pipe into the helium vessel or into a turret by means of the port component that can interface with a standard service siphon fitted with different tips.

An advantage of this arrangement is that the first opening of the port component may be configured for aligning a service siphon, for example a standard helium service siphon, in the siphon cone.

An option of this arrangement is that the inventive helium vessel port comprises a support component configured for maintaining alignment of a service siphon and/or for maintaining alignment of the port component with respect to the siphon cone and/or with respect to the outlet opening of the pipe.

The port arrangement can comprise a turret. The helium vessel port arrangement or the turret can comprise a wall. The pipe can be positioned in the wall. For instance, the pipe can be partly or completely positioned within the wall. The pipe is preferably welded into the wall.

The first opening of the port component may comprise a centerline and the second opening of the port component may comprise a centerline. The siphon cone may comprise a centerline, which corresponds with the centerline of the first opening and/or the second opening and/or a centerline of a service siphon. In other words, the centerline of the siphon cone may be an elongation of the centerline of the first opening and/or the second opening and/or a centerline of a service siphon or the centerline of the siphon cone may be identical with the centerline of the first opening and/or the second opening and/or a centerline of a service siphon. This has the advantage, that the service siphon can easily be inserted and fitted into the siphon cone.

The helium vessel port arrangement may comprise a vessel examination tube, which is configured for inserting a service siphon into the port component. The vessel examination tube may comprise an outer tube and an inner tube and may be configured for inserting the service siphon into the port component via the outer tube.

The helium vessel port arrangement preferably comprises a service siphon with a tip comprising an opening, wherein the tip is fitted into the port component and configured such that the third opening of the port component and/or the outlet opening of the pipe are/is closed by means of the tip and the opening of the tip is in flow connection with the siphon cone. This configuration provides the possibility to provide a helium vessel with helium from the service siphon while the coldhead can be exchanged or de-ice operation can be carried out without ramping down the magnet.

In a further variant the helium vessel port arrangement can comprise a service siphon with a tip. The tip may have or comprise an opening. The tip may be fitted into the port component and configured such that the siphon cone is closed by means of the tip and the opening of the tip is in flow connection with the third opening of the port component and/or with the outlet opening of the pipe. Preferably, the opening of the tip is only in flow connection with the third opening of the port component and/or with the outlet opening of the pipe. This configuration provides the possibility to provide the pipe and for example a coldhead sock with helium gas from the service siphon. By means of the described tip the coldhead sock can be isolated from a helium vessel or from a turret. The configuration can be used to de-ice a connecting tube. Moreover, the configuration can also provide positive flow of helium gas to prevent air ingress during coldhead exchange. The tip can remain in place until the coldhead has cooled down. The coldhead could be force cooled by using cold helium through the service siphon and venting via a transit line and a valve, for example a bypass valve.

Generally, the service siphon is preferably a helium siphon. The helium vessel port arrangement can comprise a turret, which may comprise the port component.

The inventive helium vessel arrangement comprises a previously described helium vessel port arrangement. It may comprise a helium vessel and a previously described helium vessel port arrangement. The helium vessel arrangement has the same advantages as the previously described helium vessel port arrangement.

The inventive magnetic resonance imaging system comprises a previously described inventive helium vessel port arrangement and/or a previously described inventive helium vessel arrangement. The inventive magnetic resonance imaging system has the same advantages as the inventive helium vessel port arrangement.

The inventive method for operating an inventive helium vessel port arrangement, as previously described, is characterized in guiding helium, preferably liquid helium, into the inlet of the pipe, through the pipe and via the outlet of the pipe into the port for guiding helium into a helium vessel. The helium can be guided from a coldhead sock into the inlet of the pipe. The inventive method has the same advantages as the previously described inventive helium vessel arrangement.

An advantage of this arrangement is that helium is guided into the inlet of the pipe, through the pipe and via the outlet of the pipe into the siphon cone and into the siphon tube.

An option of this arrangement is that the method comprises the step of closing the third opening of the port component and/or closing the outlet opening of the pipe, and guiding helium from the service siphon into the siphon cone and into the siphon tube. This allows filling of a helium vessel with helium from the service siphon while the coldhead can be exchanged or de-ice operation can be carried out without ramping down the magnet.

As a further option the method comprises the step of closing the siphon cone by means of the tip of the service siphon and guiding helium from the service siphon into the third opening of the port component and/or into the outlet opening of the pipe. By means of the described tip the coldhead sock can be isolated from a helium vessel and/or from a turret. The configuration can be used to de-ice a connecting tube. Moreover, the configuration can also provide positive flow of helium gas to prevent air ingress during coldhead exchange. The tip can remain in place until the coldhead has cooled down. The coldhead could be force cooled by using cold helium through the service siphon and venting via a transit line and a valve, for example a bypass valve.

Generally, an advantage of the present invention lies in the addition of an interface or port component at the end of the coldhead connection pipe situated in line with a siphon port, for example at the lower end of a turret. The design of the interface or port component allows the siphon to operate in the usual way. In addition the following operations are now possible. It is possible to isolate the coldhead sock from the helium vessel. This enables cold head exchange at field without risk of asphyxiation. Moreover, there is the ability to de-ice the cold head connection tube without removing the cold head, potentially with the magnet still at field. Furthermore, there is the ability to create a controlled flow of helium gas through the pipe and a connection tube and out through the coldhead sock to prevent air ingress during coldhead exchange. Additionally, there is the ability to keep the coldhead sock isolated from the helium vessel whilst the coldhead cools down to prevent warm gas entering the helium vessel and quenching the magnet. Moreover, there is the ability to force cool the coldhead with cold helium gas to prevent warm gas quench.

DESCRIPTION OF THE PREFERRED EMBODIMENTS

The inventive helium vessel port arrangement for a magnetic resonance imaging (MRI) system, the helium vessel arrangement and the inventive method for operating the same will now be described with reference to FIGS. 1 to 6.

Figure 1:
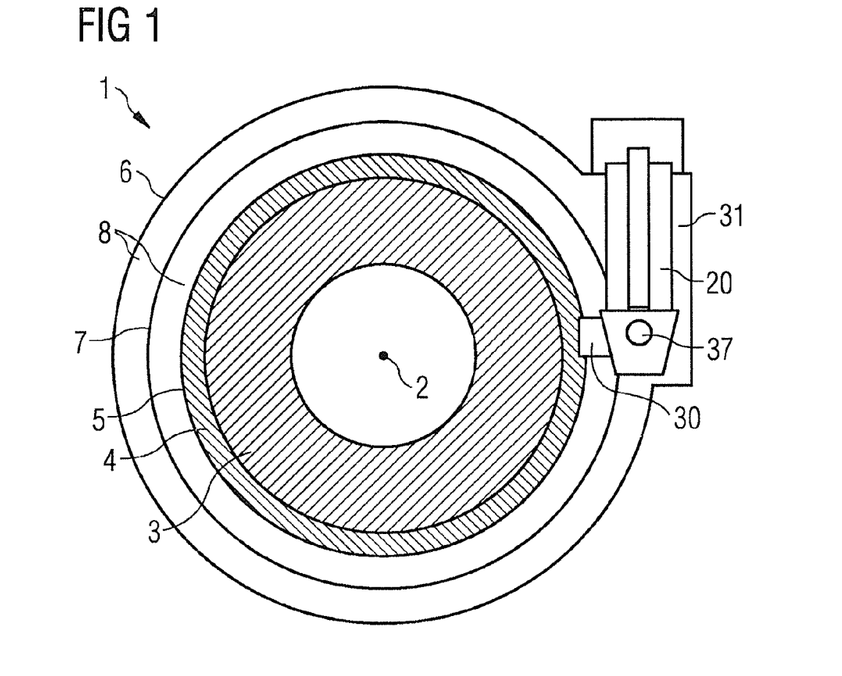
FIG. 1 schematically shows a magnet arrangement in a sectional view along a centerline of the magnet.

FIG. 1 schematically shows a magnet arrangement 1 in a sectional view along a centerline 2 of the magnet 3. The magnet coils 3 are surrounded by a helium vessel 5 providing a helium space 4. The helium vessel 5 is encased by a vacuum chamber 6. The vacuum chamber 6 comprises at least one radiation shield 7 and a vacuum space 8.

A turret 31 combined with a cold head is connected with the vacuum chamber. The turret comprises a port 30 for guiding helium into the helium vessel 5, which is connected with the helium vessel 5. The turret 31 further comprises a vent tube 20 and a tube or connection pipe 37 to a cold head sock. The vent tube 20 comprises a centerline 21. The port 30 is connected with the tube or connection pipe 37 to a cold head sock.

A magnetic resonance imaging system will comprise further equipment (not illustrated), such as gradient and field coils, shim coils and a patient table. One or more system electronics cabinet(s) house(s) a magnet supervisory system and other control and measurement equipment which control operation of the magnet, and such further equipment, over communications lines. The magnet supervisory system receives data input from appropriate system sensors attached to various components of the MRI system. Helium compressor is typically an electromechanical device. It is conventionally mechanically enclosed within the system electronics cabinet(s) but the helium compressor is conventionally a standalone device.

Figure 2:
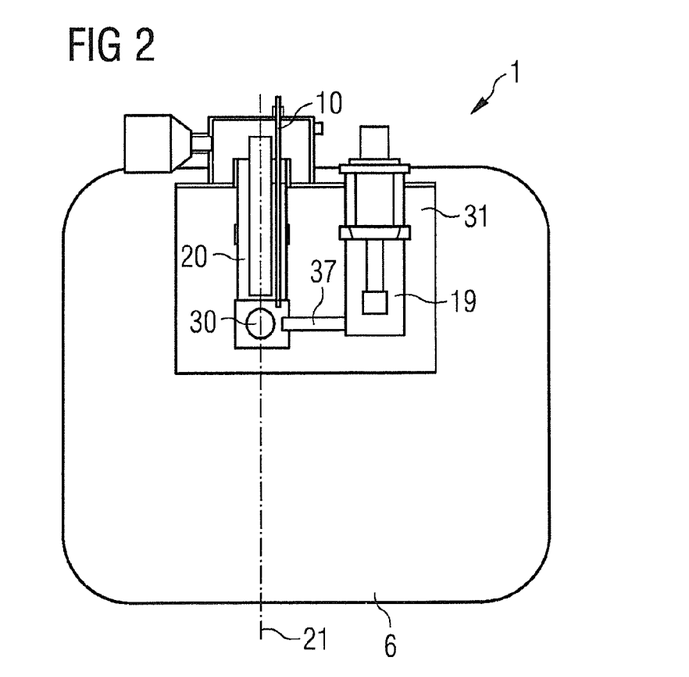
FIG. 2 schematically shows a side view of a magnet and a sectional view of a turret and a cold head.

FIG. 2 schematically shows a side view of a vacuum chamber 6 with a magnet 3 and a sectional view of a turret 31 combined with a cold head. The turret 31 comprises a cold head arrangement 9, the vent tube 20 and the port 30 into the helium vessel 5. The cold head arrangement 9 comprises a cold head sock 19 and is connected with the port 30 via the tube or pipe 37. The vent tube 20 comprises a removable siphon tube 10.

Figure 3:
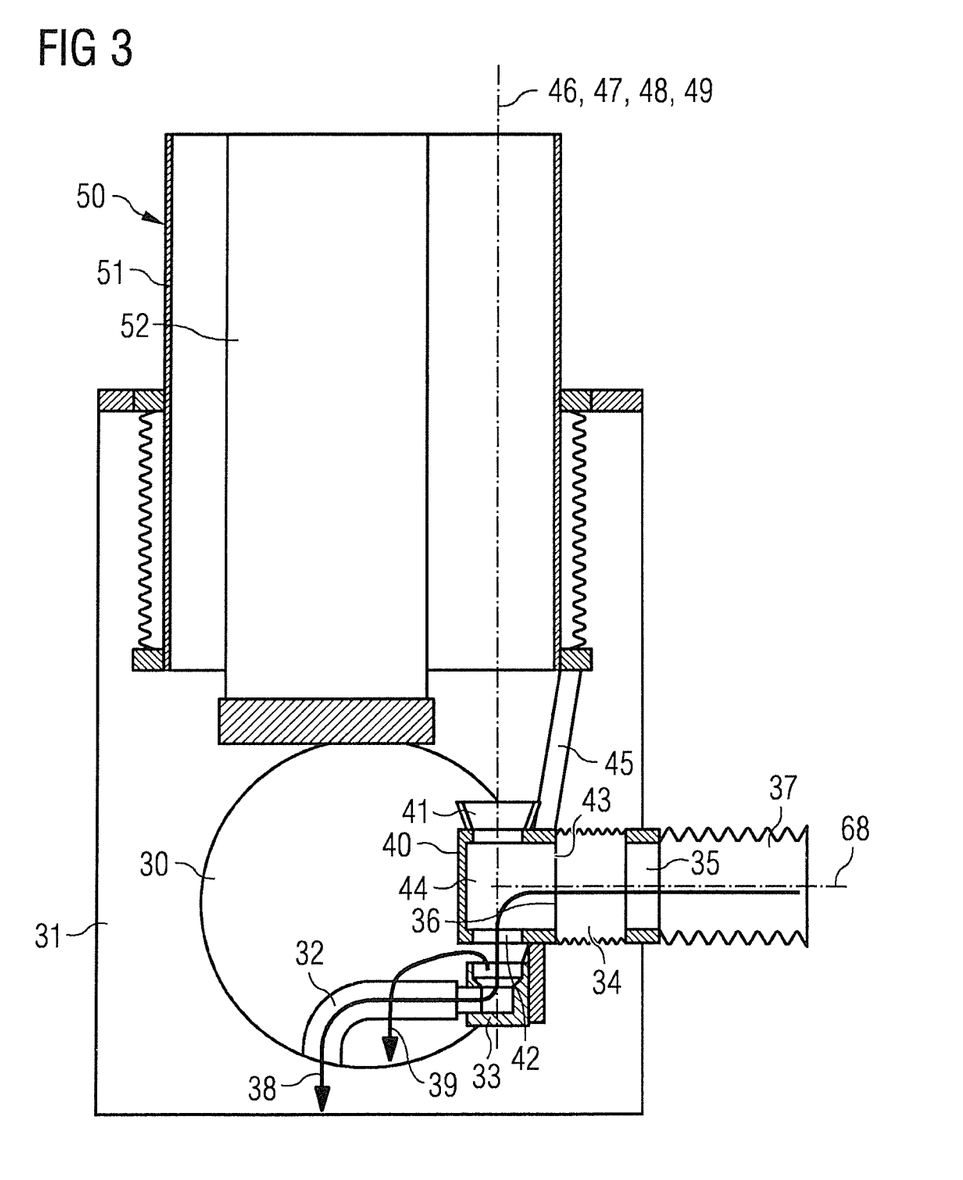
FIG. 3 schematically shows an inventive helium vessel port arrangement in a sectional view.

FIG. 3 schematically shows an inventive helium vessel port arrangement in a sectional view. The helium vessel port arrangement comprises the port 30 for guiding helium into a helium vessel 5. The port 30 may be part of a turret 31. The port 30 comprises a siphon tube 32, a siphon cone 33 and a pipe or flow channel 34. The siphon cone 33 is in flow connection with the siphon tube 32.

The pipe or flow channel 34 comprises an inlet opening 35 and an outlet opening 36. The inlet opening 35 is configured for connecting it with the coldhead sock 19, more precisely for providing a flow connection with the cold head sock 19. The outlet opening 36 is in flow connection with the port 30 and the siphon cone 33. The flow direction of the helium, preferably liquid helium, is shown by arrow 38 into the siphon tube and by arrow 39 directly into the port 30.

The port 30 comprises a port component 40. The port component 40 comprises a flow channel 44 with a first opening 41 configured for connecting the flow channel 44 with a service siphon (not shown in FIG. 3), a second opening 42 which is in flow connection with the siphon cone 33, and a third opening 43 which is in flow connection with the outlet opening 36 of the pipe 34.

The port 30 and/or the turret 31 may comprise a wall. In FIG. 3 the pipe 34 is positioned in the wall of the port 30 and/or the turret 31. For instance, the pipe 34 can be partly or completely positioned within the wall. The pipe 34 is preferably welded into the wall.

Advantageously, the first opening 41 of the port component 40 is configured for aligning a service siphon, for example a standard helium service siphon, in the siphon cone 33.

Optionally, the inventive port arrangement comprises a support component 45 configured for maintaining alignment of a service siphon and/or for maintaining alignment of the port component 40 with respect to the siphon cone 33 and/or with respect to the outlet opening 36 of the pipe 34.

The first opening 41 of the port component 40 may comprise a centerline 46 and the second opening 41 of the port component 40 may comprise a centerline 47. The siphon cone 33 may comprise a centerline 48, which corresponds with the centerline 46 of the first opening 41 and/or which corresponds with the centerline 47 the second opening 42 and/or which corresponds with a centerline 49 of a service siphon. In other words, the centerline of the siphon cone 33 may be an elongation of the centerline of the first opening 41 and/or the second opening 42 and/or a centerline 49 of a service siphon or the centerline of the siphon cone 33 may be identical with the centerline of the first opening 41 and/or the second opening 42 and/or a centerline 48 of a service siphon. This has the advantage, that the service siphon can easily be inserted and fitted into the siphon cone 33.

Furthermore, the third opening 43 may comprise a centerline 68, which may run perpendicular to the centerline 46 of the first opening 41 and/or perpendicular to the centerline 47 of the second opening 42.

The port arrangement optionally comprises a vessel examination tube 50, which is configured for inserting a service siphon into the port component 40. The vessel examination tube 50 may comprise an outer tube 51 and an inner tube 52 and may be configured for inserting the service siphon into the port component 40 via the outer tube 51. In FIG. 3 the vessel examination tube 50 is for example welded into the wall of the port 30 or into the turret 31. The port arrangement can generally comprise a turret 31, which comprises the port component 40.

Figure 4:
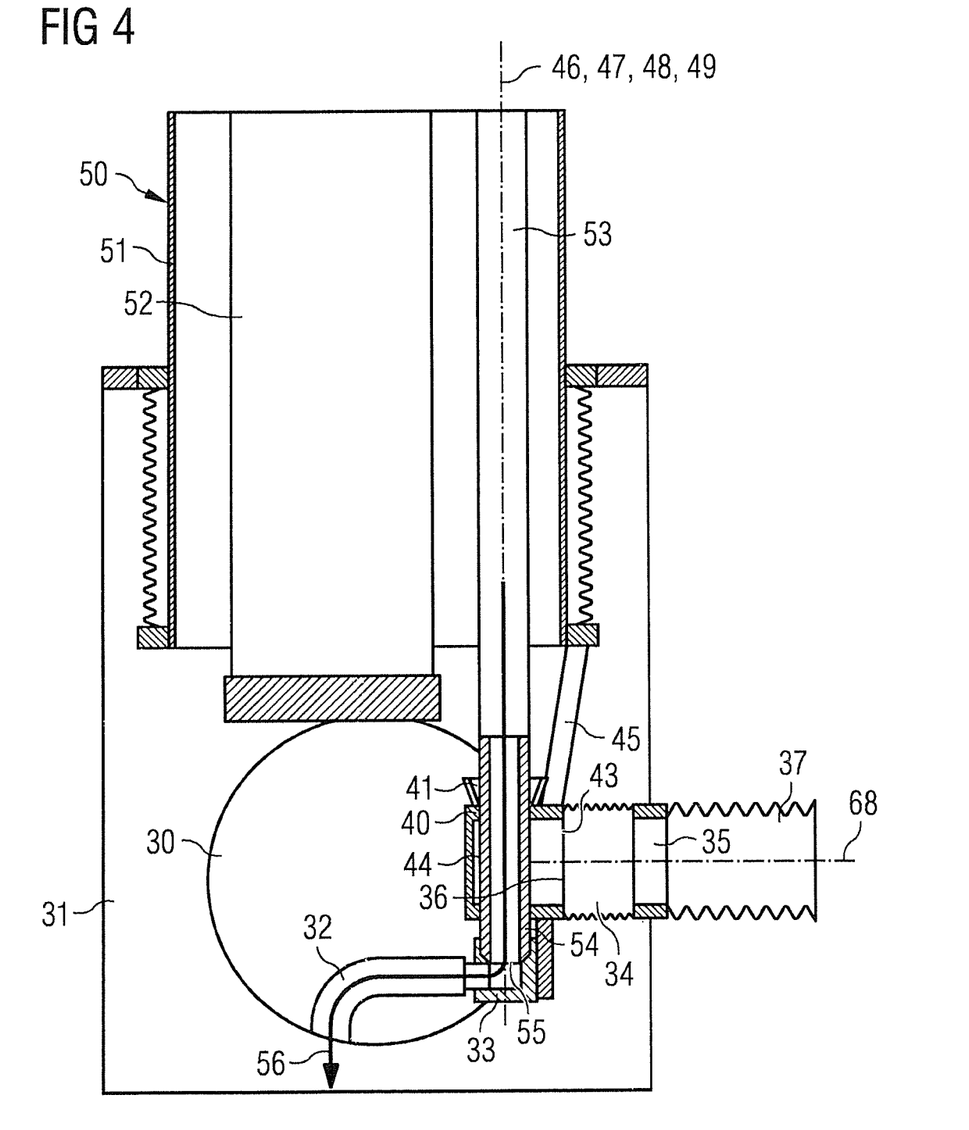
FIG. 4 schematically shows the inventive helium vessel port arrangement with a first variant of a service siphon in a sectional view.

FIG. 4 schematically shows the port arrangement of FIG. 3 with a first variant of a service siphon 53 in a sectional view. Generally, the service siphon 53 is preferably a helium siphon. The service siphon 53 comprises a tip 54 comprising an opening 55, wherein the tip 54 is fitted into the port component 40 and configured such that the third opening 43 of the port component 40 and the outlet opening 36 of the pipe 34 are closed by means of the tip 54. The opening 55 of the tip 54 is in flow connection 56 with the siphon cone 33. The flow direction of the helium, preferably liquid helium, from the service siphon 53 into the siphon tube 32 via the siphon cone 33 is shown by an arrow 56.

With this configuration helium from the service siphon 53 can be guided into the port 30 and further into the helium vessel 5, for example while the coldhead can be exchanged can be carried out without ramping down the magnet.

Figure 5:
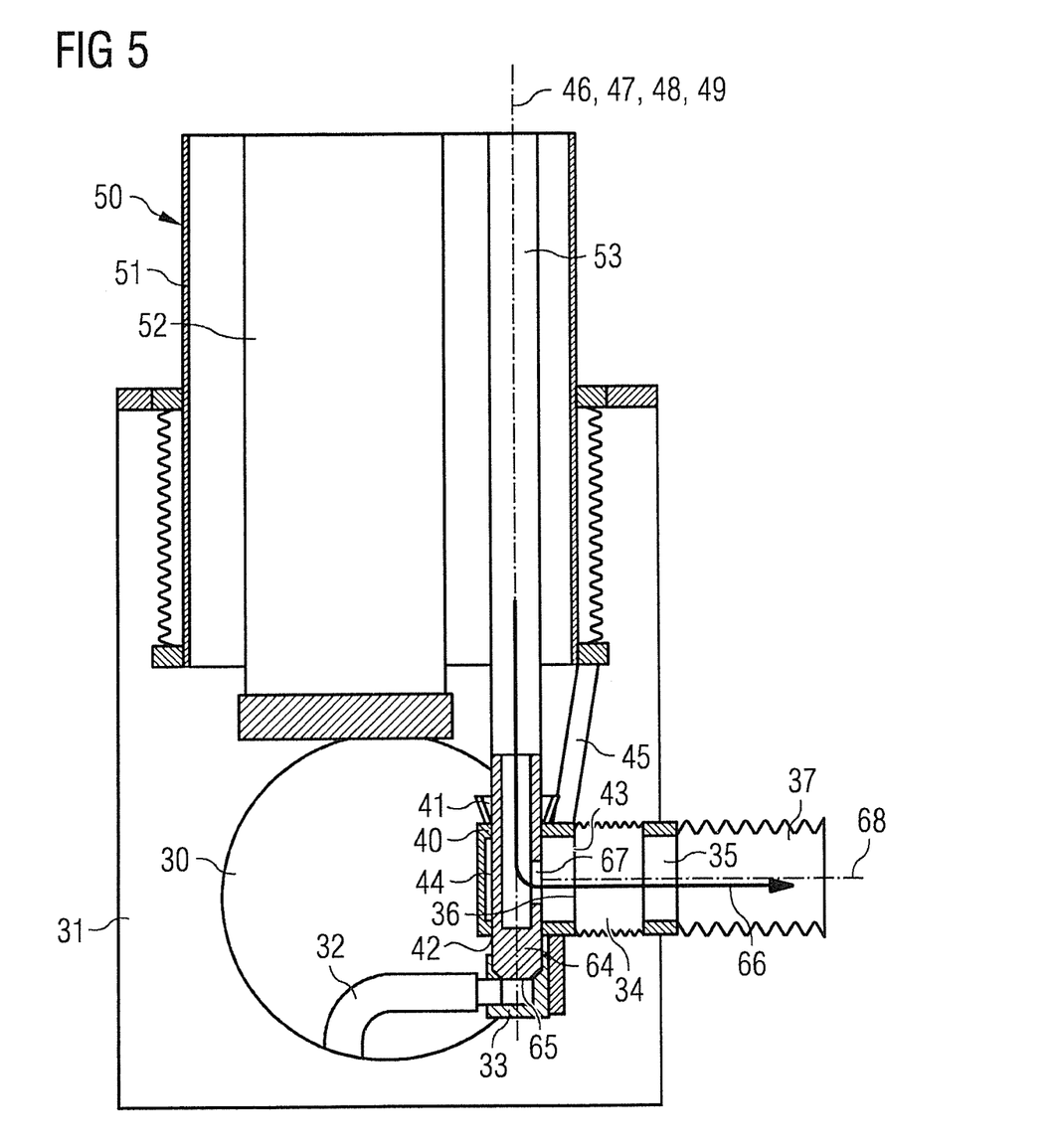
FIG. 5 schematically shows the inventive helium vessel port arrangement with a second variant of a service siphon in a sectional view.

FIG. 5 schematically shows the port arrangement with a second variant of a service siphon 63 in a sectional view. The service siphon 63 with a tip 64. The tip 64 comprises an opening 67. The tip 64 is fitted into the port component 40 and configured such that the siphon cone is closed by means of the tip 64, for example using a means for closing the siphon cone 65. The opening 67 of the tip 64 is in flow connection with the third opening 43 of the port component and with the outlet opening 36 of the pipe 34. Preferably the opening 67 of the tip 64 is only in flow connection with the third opening 43 of the port component 40 and with the outlet opening 37 of the pipe 34.

With this configuration the pipe 34 and for example a coldhead sock can be provided with helium, for instance liquid or gaseous helium, from the service siphon 63. By means of the described tip 64 the coldhead sock can be isolated from the port 30 and from the helium vessel 5 or from the turret 31. The configuration can be used to de-ice a connecting tube 37. Moreover, by guiding helium gas into the pipe 34 from the outlet opening 36 towards the inlet opening 35 air ingress during coldhead exchange can be prevented. The tip 64 can remain in place until the coldhead has cooled down. The coldhead can be force cooled by using cold helium through the service siphon and venting via a transit line and a valve, for example a bypass valve.

Figure 6:
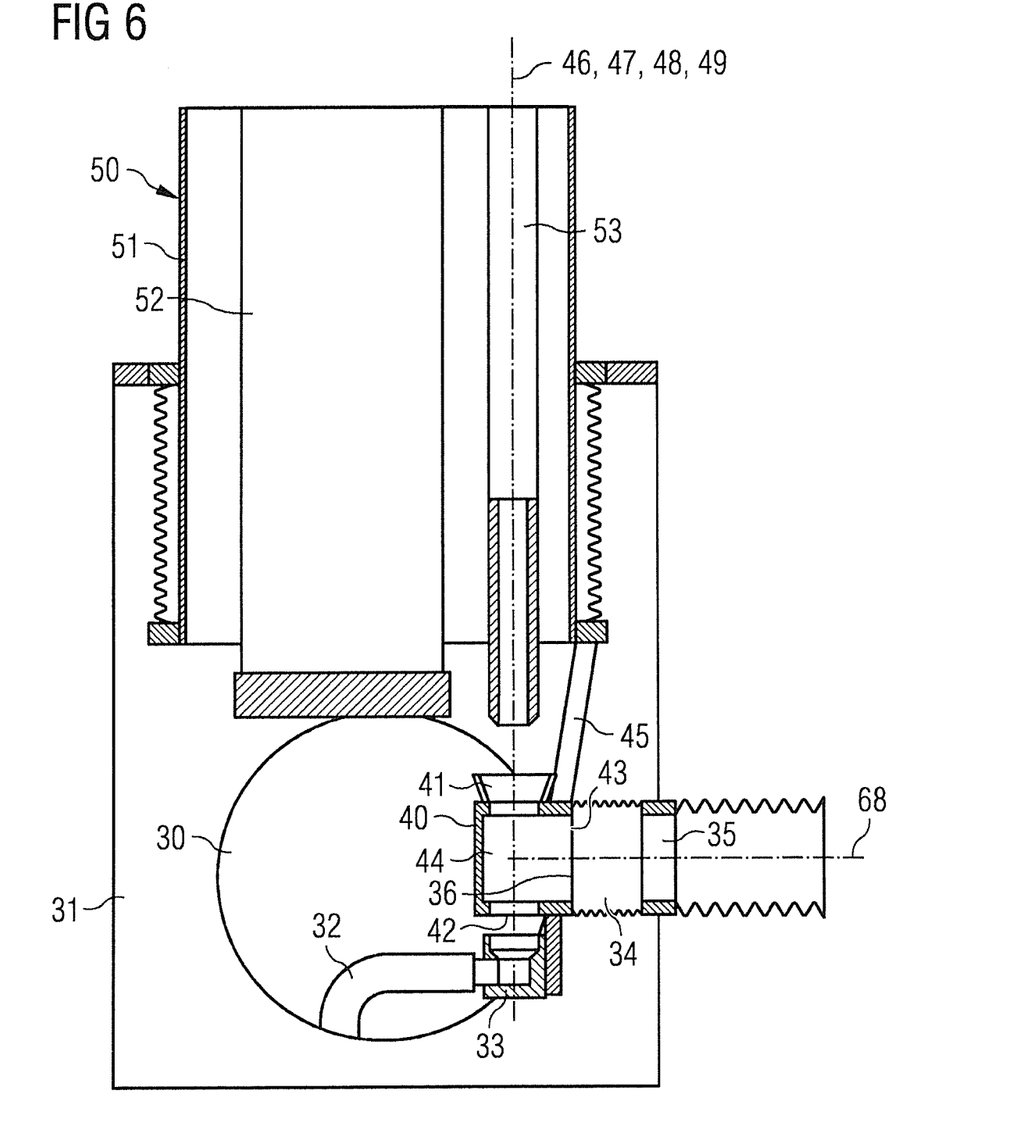
FIG. 6 schematically shows a sectional view of the inventive helium vessel port arrangement while inserting a service siphon.

FIG. 6 schematically shows a sectional view of the inventive port arrangement while inserting a service siphon 53, as described in conjunction with FIG. 3. Alternatively a service siphon 63, as described in conjunction with FIG. 4, can be inserted. This is the position of the syphon for topping up the magnet with helium.

While the present application has been described with particular reference to cooling using helium cryogen, the present invention may be applied to superconducting magnets cooled by other cryogens, such as hydrogen, nitrogen, neon, argon.

We claim as our invention:

1. A cryogen vessel port arrangement for a magnetic resonance imaging system, said cryogen vessel port arrangement comprising;
   a port for guiding cryogen into a cryogen vessel, the port comprising a siphon tube, a siphon cone, which is in flow connection with the siphon tube, and a pipe with an inlet opening and an outlet opening, wherein the inlet opening is configured for connection to a coldhead sock and the outlet opening is in flow connection with the port and the siphon cone;
   said port comprising a port component having a flow channel with a first opening configured for connection to a service siphon, a second opening in flow connection with the siphon cone, and a third opening in flow connection with the outlet opening of the pipe;
   a service siphon with a first tip comprising an opening, wherein the tip is configured to be fitted into the port component and configured to close at least one of the third opening of the port component and the outlet opening of the pipe by the first tip, and the opening of the tip is in flow connection with the siphon cone; and
a service siphon with a second tip comprising an opening, wherein the second tip is configured to fit into the port component and to cause the siphon cone to be closed by the second tip, and the opening of the second tip is in flow connection with at least one of the third opening of the port component and the outlet opening of the pipe.

2. The cryogen vessel port arrangement, as claimed in claim 1, wherein:
the first opening is configured to align the service siphon in the siphon cone.

3. The cryogen vessel port arrangement, as claimed in claim 1, comprising:
a support component configured to maintain at least one alignment of the service siphon and the port component with respect to at least one of the siphon cones and the outlet opening of the pipe.

4. The cryogen vessel port arrangement, as claimed in claim 1, wherein:
the pipe is positioned in the wall of a turret.

5. The cryogen vessel port arrangement, as claimed in claim 1, wherein:
the first opening comprises a centerline, the second opening comprises a centerline and the siphon cone comprises a centerline, which corresponds with at least one of the centerline of the first opening and the centerline of the second opening and the centerline of the service siphon.

6. The cryogen vessel port arrangement, as claimed in claim 1, comprising:
a vessel examination tube configured to insert the service siphon into the port component.

7. The cryogen vessel port arrangement, as claimed in claim 1, wherein:
the service siphon is a cryogen siphon.

8. A cryogen vessel arrangement comprising:
a cryogen vessel;
a port for guiding cryogen into said cryogen vessel, the port comprising a siphon tube, a siphon cone, which is in flow connection with the siphon tube, and a pipe with an inlet opening and an outlet opening, wherein the inlet opening is configured for connection to a coldhead sock and the outlet opening is in flow connection with the port and the siphon cone;
said port comprising a port component having a flow channel with a first opening configured for connection to a service siphon, a second opening in flow connection with the siphon cone, and a third opening in flow connection with the outlet opening of the pipe;
a service siphon with a first tip comprising an opening, wherein the tip is configured to be fitted into the port component and configured to close at least one of the third opening of the port component and the outlet opening of the pipe by the first tip, and the opening of the tip is in flow connection with the siphon cone; and
a service siphon with a second tip comprising an opening, wherein the second tip is configured to fit into the port component and to cause the siphon cone to be closed by the second tip, and the opening of the second tip is in flow connection with at least one of the third opening of the port component and the outlet opening of the pipe.

9. A method for operating a cryogen vessel port arrangement said cryogen vessel port arrangement comprising a port for guiding cryogen into a cryogen vessel, the port comprising a siphon tube, a siphon cone, which is in flow connection with the siphon tube, and a pipe with an inlet opening and an outlet opening, wherein the inlet opening is configured for connection to a coldhead sock and the outlet opening is in flow connection with the port and the siphon cone; said port comprising a port component having a flow channel with a first opening configured for connection to a service siphon, a second opening in flow connection with the siphon cone, and a third opening in flow connection with the outlet opening of the pipe; a service siphon with a first tip comprising an opening, wherein the tip is configured to be fitted into the port component and configured to close at least one of the third opening of the port component and the outlet opening of the pipe by the first tip, and the opening of the tip is in flow connection with the siphon cone; and a service siphon with a second tip comprising an opening, wherein the second tip is configured to fit into the port component and to cause the siphon cone to be closed by the second tip, and the opening of the second tip is in flow connection with at least one of the third opening of the port component and the outlet opening of the pipe, said method comprising:
guiding a cryogen into the cryogen vessel via the inlet of the pipe, through the pipe and via the outlet of the pipe into the port.

10. The method for operating a cryogen vessel port arrangement, as claimed in claim 9, comprising:
guiding the cryogen is guided into the inlet of the pipe, through the pipe and via the outlet of the pipe into the siphon cone and into the siphon tube.

11. The method for operating a cryogen vessel port arrangement, as claimed in claim 9, comprising:
closing the third opening of the port component and/or the outlet opening of the pipe, and guiding the cryogen from the service siphon into the siphon cone and into the siphon tube.

12. The method for operating a cryogen vessel port arrangement, as claimed in claim 9, comprising:
closing the siphon cone by means of the first tip of the service siphon and guiding cryogen from the service siphon into at least one of the third opening of the port component and the outlet opening of the pipe.

13. A method for operating a cryogen vessel port as claimed in claim 9 comprising guiding helium into said cryogen vessel, as said cryogen.

14. A magnetic resonance imaging system comprising:
a magnetic resonance data acquisition scanner comprising a superconducting basic field magnet;
a cryogen vessel that places said superconducting basic field magnet in a superconducting state;
a port for guiding cryogen into said cryogen vessel, the port comprising a siphon tube, a siphon cone, which is in flow connection with the siphon tube, and a pipe with an inlet opening and an outlet opening, wherein the inlet opening is configured for connection to a coldhead sock and the outlet opening is in flow connection with the port and the siphon cone;
said port comprising a port component having a flow channel with a first opening configured for connection to a service siphon, a second opening in flow connection with the siphon cone, and a third opening in flow connection with the outlet opening of the pipe;
a service siphon with a first tip comprising an opening, wherein the tip is configured to be fitted into the port component and configured to close at least one of the third opening of the port component and the outlet opening of the pipe by the first tip, and the opening of the tip is in flow connection with the siphon cone; and
a service siphon with a second tip comprising an opening, wherein the second tip is configured to fit into the port component and to cause the siphon cone to be closed by the second tip, and the opening of the second tip is in flow connection with at least one of the third opening of the port component and the outlet opening of the pipe.

\* \* \* \* \*